(12) United States Patent
You et al.

(10) Patent No.: US 10,256,716 B2
(45) Date of Patent: Apr. 9, 2019

(54) POWER FACTOR CORRECTION CIRCUIT, MULTIPLIER AND VOLTAGE FEED-FORWARD CIRCUIT

(71) Applicant: COSEMITECH (SHANGHAI) CO., LTD, Minhang District Shanghai (CN)

(72) Inventors: Jian You, Minhang District Shanghai (CN); Xiaoping Yin, Minhang District Shanghai (CN)

(73) Assignee: COSEMITECH (SHANGHAI) CO., LTD., Minhang District Shanghai (CN)

( * ) Notice: Subject to any disclaimer, the term of this patent is extended or adjusted under 35 U.S.C. 154(b) by 0 days.

(21) Appl. No.: 15/546,645

(22) PCT Filed: Jan. 25, 2016

(86) PCT No.: PCT/CN2016/072001
§ 371 (c)(1),
(2) Date: Jul. 26, 2017

(87) PCT Pub. No.: WO2016/119658
PCT Pub. Date: Aug. 4, 2016

(65) Prior Publication Data
US 2018/0013341 A1 Jan. 11, 2018

(30) Foreign Application Priority Data
Jan. 27, 2015 (CN) .......................... 2015 1 0040919

(51) Int. Cl.
*H02M 1/42* (2007.01)
*H02M 3/335* (2006.01)
(Continued)

(52) U.S. Cl.
CPC ....... *H02M 1/4208* (2013.01); *H02M 1/4225* (2013.01); *H03D 7/1433* (2013.01);
(Continued)

(58) Field of Classification Search
CPC .............. H02M 1/4208; H02M 1/4225; H03D 7/1433; H03D 7/1441; H03D 7/1458; Y02P 80/112; Y02B 70/126
(Continued)

(56) References Cited

U.S. PATENT DOCUMENTS 9,141,239 B2 * 9/2015 Yun, II .................... G06F 3/044
2003/0184366 A1 10/2003 Yoshida
(Continued)

FOREIGN PATENT DOCUMENTS

CN 101090267 A 9/2007
CN 102594118 A 7/2012
(Continued)

OTHER PUBLICATIONS

Chinese Office Action and Search Report for Chinese Application No. 201510040919.8 dated Dec. 18, 2017, 5 pages.
(Continued)

*Primary Examiner* — Brandon S Cole
(74) *Attorney, Agent, or Firm* — Cantor Colburn LLP

(57) ABSTRACT

A voltage feed-forward circuit, a multiplier using the voltage feed-forward circuit, and a power factor correction circuit using the multiplier. The voltage feed-forward circuit is used to maintain and output a peak voltage (Vff) of an input voltage (Vin), and includes first switch element (S1), a logic control unit (U1), a second switch element (S2), a first capacitor (C1), a third switch element (S3) and a second capacitor (C2). The first control signal ($\Phi 1$) and the second control signal ($\Phi 2$) begin to be provided at the same time, and the first control signal ($\Phi 1$) stops being provided when a voltage of the second end of the first capacitor (C1) is greater than the peak voltage (Vff) of the input voltage (Vin).

16 Claims, 12 Drawing Sheets

(51) Int. Cl.
*G06F 3/044* (2006.01)
*H03K 19/00* (2006.01)
*H03D 7/14* (2006.01)

(52) U.S. Cl.
CPC ......... *H03D 7/1441* (2013.01); *H03D 7/1458* (2013.01); *Y02B 70/126* (2013.01); *Y02P 80/112* (2015.11)

(58) Field of Classification Search
USPC ............................... 327/365–508; 326/1–136
See application file for complete search history.

(56) References Cited

U.S. PATENT DOCUMENTS

2006/0152947 A1* 7/2006 Baker ................. H02M 1/4241
 363/16
2009/0040796 A1* 2/2009 Lalithambika .... H02M 3/33507
 363/21.17
2011/0193587 A1 8/2011 Payson
2011/0255312 A1* 10/2011 Lin ................... H02M 3/33523
 363/21.16
2013/0336031 A1 12/2013 McCune, Jr.
2016/0190937 A1* 6/2016 Lin ................... H02M 3/33507
 363/21.16

FOREIGN PATENT DOCUMENTS

CN 102710118 A 10/2012
CN 103066827 A 4/2013

OTHER PUBLICATIONS

CN Office Action for related CN Application No. 201510041339.0; dated Apr. 18, 2018; 6 pages.

* cited by examiner

POWER FACTOR CORRECTION CIRCUIT, MULTIPLIER AND VOLTAGE FEED-FORWARD CIRCUIT

CROSS-REFERENCES TO RELATED APPLICATIONS

This patent application is a 371 of International Application No. PCT/CN2016/072001, filed Jan. 25, 2016 which claims the priority of Chinese Application No. 201510040919.8, filed Jan. 27, 2015, which is incorporated herein by reference in their entirety.

TECHNICAL FIELD

The present disclosure relates to the field of power management technology, and more particularly to a voltage feed-forward circuit, a multiplier using the voltage feed-forward circuit, and a power factor correction circuit using the multiplier.

BACKGROUND

For more efficient use of grid power, the power factor correction technology has been widely used in the switching power supply technology. In the prior art, it is common practice to insert a power factor correction (PFC) circuit between the diode rectifier bridge and the load of the circuit so that the current drawn from the AC supply is also a sine wave signal and its phase changes with the supply voltage. After inserting the power factor correction circuit, the power factor value can be close to 1.

The implementation of a PFC circuit is shown in FIG. 1, which is applied to a boost converter. The boost converter comprises an inductor L, a switch device S, a freewheeling diode D, an output capacitor Cout and an integrated PFC circuit. The supply voltage Vac serves as an input voltage of the boost converter after passing the diode rectifier bridge, the boost converter converts the input voltage to obtain the output voltage Vout. The PFC circuit comprises an error amplifier U1, a multiplier U2, a comparator U3, an RS flip-flop U4, a driver module U5, and a zero current detection circuit (ZCD) U6. The PFC circuit samples the output voltage Vout and inputs it to the error amplifier U1. One input of the multiplier U2 is the output error feedback signal Verror of the error amplifier U1 and the other input is the divided signal Vin of the supply voltage Vac, so that the output current waveform becomes a sine wave following the supply voltage waveform. A sampling resistor R1 and the external switch device S are connected in series to obtain a switch current signal. When a voltage of the sampling resistor R1 is higher than an output of the multiplier U2, the comparator U3 and the RS flip-flop U4 turn over and turn off the external switch device S by the driver module U5. When the zero current detection circuit U6 detects that the inductor current drops to 0, the external switch device S is turned on. The above control mode realizes the critical conduction mode control through a simple way, which is especially suitable for power factor correction circuit with small and medium power.

From the standpoint of stability, the open-loop gain (Gloop) of the PFC circuit is proportional to the square of the supply voltage Vac, the load (Rload) and the gain (K) of the multiplier, which is:

$$Gloop = Vac^2 \times Rlaod \times K \qquad (1)$$

In the above PFC circuit, the loop gain is equal to the open-loop gain (Gloop). Since the loop gain is a single-pole system, the unity-gain bandwidth increases as the loop gain increases, which may cause instability of the circuit.

In view of the above problem, one solution is to use a non-linear multiplier, that is, to reduce the gain of the multiplier correspondingly when the input voltage increases, thereby approximately maintaining a constant loop gain. However, the solution has disadvantages of sacrificing the performance of the multiplier and increasing the distortion and non-linearity, which may reduce the power factor correction effect of the PFC circuit.

Another solution to this problem is to introduce a voltage feed-forward circuit that compensates for changes in gain by voltage feed-forward. Specifically, to obtain a peak voltage of the input voltage, the peak voltage is input to the multiplier for operation after passing a $1/V^2$ circuit, so that the loop gain can be made independent of the input voltage. The solution maintains the linearity of the multiplier, so a better power factor correction effect can be obtained.

In the prior art, a voltage feed-forward circuit is implemented as shown in FIG. 2, which uses an external resistor Rff and an external capacitor Cff to form a peak voltage holding circuit. When the input voltage Vin changes rapidly, the internal charge circuit would rapidly charge the external capacitor Cff. When the input voltage Vin is rapidly reduced, the detection module U7 would turn on the switching transistor M2 to quickly discharge charges on the external capacitor Cff to achieve fast follow-up of changes in the input voltage. The disadvantage of the voltage feed-forward circuit in FIG. 2 is that an additional PIN is required to connect the external resistor Rff and the external capacitor Cff. In addition, the values of the external capacitor Cff and the external resistor Rff are compromised, for example, if the external capacitor Cff values too low, there would be a greater ripple on the external capacitor Cff, thereby affecting the output of the multiplier, increasing the distortion, and reducing the power factor correction effect. If the external capacitor Cff values too high, the response is slowed down, which needs longer time to set the correct voltage feed-forward value, thereby causing larger over-voltage or under-voltage in the output voltage.

Therefore, providing a technical proposal to further improve these defects becomes an urgent issue at present.

SUMMARY

In view of some or all of the problems in the prior art, the present disclosure provides a voltage feed-forward circuit, a multiplier using the voltage feed-forward circuit, and a power factor correction circuit using the multiplier.

Other features and advantages of the present disclosure would become apparent from the following detailed description, or partly be obtained by practice of the present disclosure.

According to a first aspect of the present disclosure, there is provided a voltage feed-forward circuit applied to a multiplier for maintaining and outputting a peak voltage of an input voltage, comprising:

a first switch element, a first end thereof connected to a supply voltage, and a control end thereof causing said first switch element to conduct in response to a first control signal;

a logic control unit used to output a second control signal during the peak voltage of said input voltage and output a third control signal during a non-peak voltage of said input voltage;

a first capacitor, a first end thereof grounded;

a second switch element, a first end thereof connected to a second end of said first switch element, a second end thereof connected to a second end of said first capacitor, and a control end thereof causing said second switch element to conduct in response to said second control signal;

a third switch element, a first end thereof connected to a second end of said first capacitor, and a control end thereof causing said third switch element to conduct in response to said third control signal;

a second capacitor, a first end thereof grounded, and a second end thereof connected to a second end of said third switch element and outputting the peak voltage of said input voltage maintained by the second end of said second capacitor;

wherein said first control signal and said second control signal begin to be provided at the same time, and the first control signal stops being provided when a voltage of the second end of the first capacitor is greater than the peak voltage of said input voltage.

In an exemplary embodiment of the present disclosure, said logic control unit is further used to output a fourth control signal during the non-peak voltage of said input voltage; said voltage feed-forward circuit further comprises:

a fourth switch element, a first end thereof connected to the second end of said first capacitor, a second end thereof grounded, and a control end thereof causes said fourth switch element to conduct in response to said fourth control signal.

In an exemplary embodiment of the present disclosure, said voltage feed-forward circuit further comprises:

a first comparator, a first input end thereof connected to a reference voltage, a second input end thereof connected to said input voltage, and an output end thereof outputting a comparison result signal of said input voltage and said reference voltage to said logic control unit.

In an exemplary embodiment of the present disclosure, said voltage feed-forward circuit further comprises:

a second comparator or a first operational amplifier, a first input end thereof connected to said input voltage, a second input end thereof connected to the first end of said first switch element, and an output end thereof outputting said first control signal to the control end of said first switch element when a voltage of the second end of said first capacitor is less than the peak voltage of said input voltage.

In an exemplary embodiment of the present disclosure, said voltage feed-forward circuit further comprises:

a first reverse-biased PN junction coupled between said supply voltage and the second end of said first capacitor;

a second reverse-biased PN junction coupled between said supply voltage and the second end of said second capacitor.

In an exemplary embodiment of the present disclosure, said voltage feed-forward circuit further comprises:

a first resistor coupled between the second end of said first switch element and the second end of said first capacitor.

In an exemplary embodiment of the present disclosure, a capacitance ratio between said first capacitor and said second capacitor is adjustable.

In an exemplary embodiment of the present disclosure, a non-overlapping time exists between said second control signal, the third control signal and the fourth control signal.

According to a second aspect of the present disclosure, there is provided a multiplier comprising any of the above voltage feed-forward circuits.

In an exemplary embodiment of the present disclosure, said multiplier further comprises:

a Gilbert multiplier circuit comprising a first and a second differential input stage and an output stage; said output stage outputs an output current obtained by operation with the inputs of said first and the second differential input stages;

a first differential voltage conversion circuit used to generate a first differential voltage based on a received voltage signal and a first reference voltage to bias said first differential input stage;

a second differential voltage conversion circuit used to generate a second differential voltage based on a received voltage signal and a second reference voltage to bias said second differential input stage;

a bias current generation circuit used to generate a bias current based on said peak voltage maintained by the second end of said second capacitor to bias said first signal conversion circuit and the second signal conversion circuit.

In an exemplary embodiment of the present disclosure, said second differential voltage conversion circuit comprises:

a MOSFET transistor, a gate thereof connected to a drain thereof, and a source thereof connected to said supply voltage;

a first BJT transistor pair comprising two NPN-type first BJT transistors, bases and collectors of two said first BJT transistors are connected to the drain of said MOSFET transistor, and emitters thereof output said second differential voltage;

a second BJT transistor pair comprising two NPN-type second BJT transistors, bases of two said second BJT transistors receive two different voltage signals respectively, and collectors thereof are connected to emitters of two said first BJT transistors respectively;

a second resistor coupled between emitters of two said second BJT transistors;

a first MOSFET transistor pair comprising two first MOSFET transistors, gates of two said first MOSFET transistors receive said bias current, sources thereof grounded, and drains thereof connected to emitters of two said second BJT transistors respectively.

In an exemplary embodiment of the present disclosure, the base of one of said second BJT transistors receives said input voltage or an error feedback voltage, the base of the other second BJT transistor receives said second reference voltage.

In an exemplary embodiment of the present disclosure, said first differential voltage conversion circuit comprises:

a second MOSFET transistor pair comprising two second MOSFET transistors, a gate of each second MOSFET transistor connected to a drain thereof, and a source thereof connected to said supply voltage;

a third BJT transistor pair comprising two third BJT transistors, bases of two said third BJT transistors receiving two different voltage signals respectively, and collectors thereof connected to drains of two said second MOSFET transistors respectively;

a third resistor coupled between emitters of two said third BJT transistors;

a third MOSFET transistor pair comprising two third MOSFET transistors, gates of two third MOSFET transistors receiving said bias current, sources thereof grounded, and drains thereof connected to emitters of two said third BJT transistors respectively;

a fourth MOSFET transistor pair comprising two fourth MOSFET transistors, gates of two said fourth MOSFET transistors connected to gates of two said second MOSFET transistors respectively, and sources thereof connected to said supply voltage;

a fourth BJT transistor pair comprising two NPN-type fourth BJT transistors, bases of two said fourth BJT transistors connected to drains of two said fourth MOSFET transistors respectively, and collectors thereof outputting said first differential voltage;

a BJT transistor, a base thereof connected with a collector thereof and connected to emitters of two said two fourth BJT transistors, and a emitter thereof grounded.

In an exemplary embodiment of the present disclosure, the base of one third BJT transistor receiving said input voltage or an error feedback voltage, the base of the other third BJT transistor receiving said first reference voltage.

In an exemplary embodiment of the present disclosure, said output stage comprises a current mirror unit, said current mirror unit comprises two current input ends and a current output end; said output stage further comprises:

a second operational amplifier, two input ends thereof connected to the current input ends of said current mirror unit respectively;

a fifth switch element, a first end thereof connected to the current output end of said current mirror unit, a second end thereof connected to one input end of said second operational amplifier, and a control end thereof connected to an output end of said second operational amplifier;

a sixth switch element, a first end thereof connected to the current output end of said current mirror unit, a second end thereof used to output said output current, and a control end thereof connected to the output end of said second operational amplifier.

According to a third aspect of the present disclosure, there is provided a power factor correction circuit comprising any of the above multipliers.

In an exemplary embodiment of the present disclosure, said power factor correction circuit is formed on an integrated circuit module, said first capacitor and the second capacitor are on-chip capacitors.

The voltage feed-forward circuit in exemplary embodiments of the present disclosure realizes maintaining the peak voltage of the input voltage by providing the first capacitor and the second capacitor, and therefore, it is not necessary to take into account the compromise of values of the external resistor and the external capacitor in the prior art. The further, since the maintaining of the peak voltage of the input voltage is effected based on sharing and redistribution of charges between said first capacitor and the second capacitor, it is possible to make the output voltage change slowly, which facilitates the filtering of the transient fluctuation of the input voltage. At the same time, by changing the ratio of the first capacitor and the second capacitor, the change slope of the output voltage can be changed. The first capacitor and the second capacitor can be on-chip capacitors to save system cost. In addition, the present exemplary embodiment uses the leakage current compensation mechanism to increase the holding time of the voltage on the internal capacitor, so that the output voltage is approximately constant during the holding time, which facilitates the stability of the multiplier. In the multiplier of exemplary embodiments of the present disclosure, since PNP transistors are not used, process requirements can be reduced and the application range of the circuit can be extended. In addition, the second operational amplifier is used to provide feedback control to improve the output current accuracy of the multiplier, ensure no current output when the input voltage error is 0, that is more accurate control of the offset voltage of the multiplier.

BRIEF DESCRIPTION OF THE DRAWINGS

The above and other features and advantages of the present disclosure will become more apparent by describing in detail the exemplary embodiments thereof with reference to the accompanying drawings.

DESCRIPTION OF THE REFERENCE SIGNS

Background

L inductor
S switch device
D free-wheeling diode
M2 switching transistor
Cout output capacitor
Cff external capacitor
R1 sampling resistor
Rff external resistor
U1 error amplifier
U2 multiplier
U3 comparator
U4 RS flip-flop
U5 driver module
U6 zero current detection circuit
U7 detection module
Vac supply voltage
Vin input voltage
Vout output voltage
Vff peak voltage

DETAILED DESCRIPTION

C1 first capacitor
C2 second capacitor
D1 first reverse-biased PN junction
D2 second reverse-biased PN junction
S1 first switch element
S2 second switch element
S3 third switch element
S4 fourth switch element
S5 fifth switch element
S6 sixth switch element
Φ1 first control signal
Φ2 second control signal
Φ3 third control signal
Φ4 fourth control signal
U1 logic control unit
U2 first comparator
U3 second comparator
U4 second operational amplifier
R1 first resistor
R2 second resistor
R3 third resistor
Q1-Q6 BJT transistor
Q50 BJT transistor
Q11, Q12 first BJT transistor
Q21, Q22 second BJT transistor
Q31, Q32 third BJT transistor
Q41, Q42 fourth BJT transistor
M0-M5 FET transistor
M11, M12 first MOSFET transistor
M21, M22 second MOSFET transistor
M31, M32 third MOSFET transistor
M41, M42 fourth MOSFET transistor
Vcc supply voltage
Vref reference voltage
Vin input voltage
Verror error feedback voltage
Vff peak voltage
Vref1 first reference voltage
Vref2 second reference voltage
IBias bias current
$I_{EE}$ current source
Iout output current

DETAILED DESCRIPTION

Exemplary embodiments will now be described in detail with reference to the accompanying drawings. However, the exemplary embodiments may be embodied in many forms and should not be construed as limited to the embodiments set forth herein. Rather, those embodiments are provided to make the present disclosure thorough and complete, and concepts of the exemplary embodiments are conveyed to those skilled in the art roundly. In addition, the technical features or circuit structures described may be combined in one or more embodiments in any suitable manner. In the following description, numerous specific details are set forth to show a full understanding of the embodiments of the present disclosure. However, those skilled in the art will appreciate that the technical solution of the present disclosure may be practiced without one or more of the specific details.

Certain terms are used to refer to specific components in the specification and claims, it should be understood by those skilled in the art that a same component may be referred to by different terms. The present specification and claims distinguish components by functional differences rather than name differences. The term "comprise" used in the entire specification and claims is an open expression and should be construed as "include but not limited to". In addition, the term "connect" here includes any direct and indirect electrical connection means.

Figure 1:
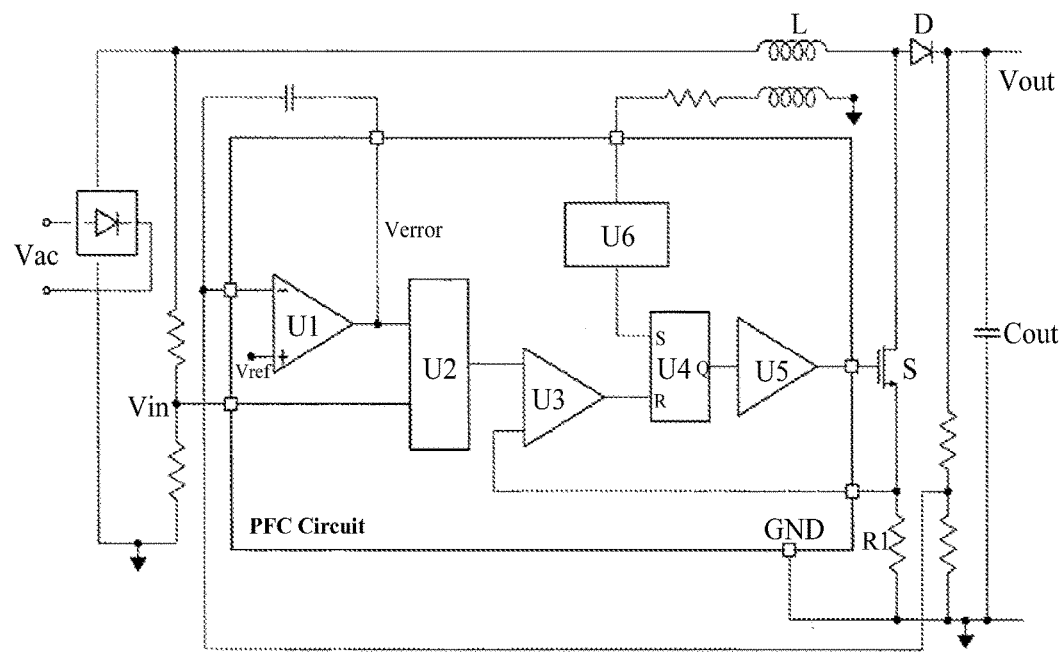
FIG. 1 is a structural diagram of a boost converter using a PFC circuit in the prior art.
Figure 2:
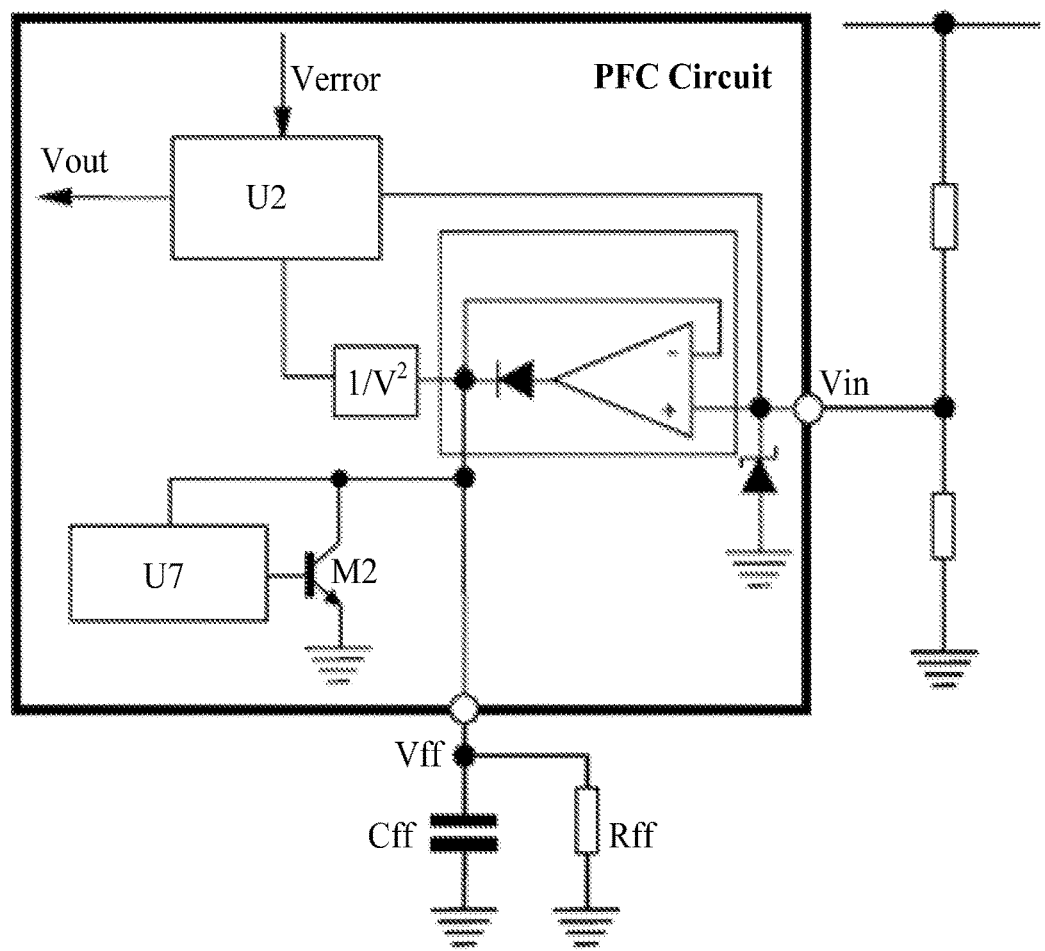
FIG. 2 is a structural diagram of a voltage feed-forward circuit in the prior art.
Figure 3:
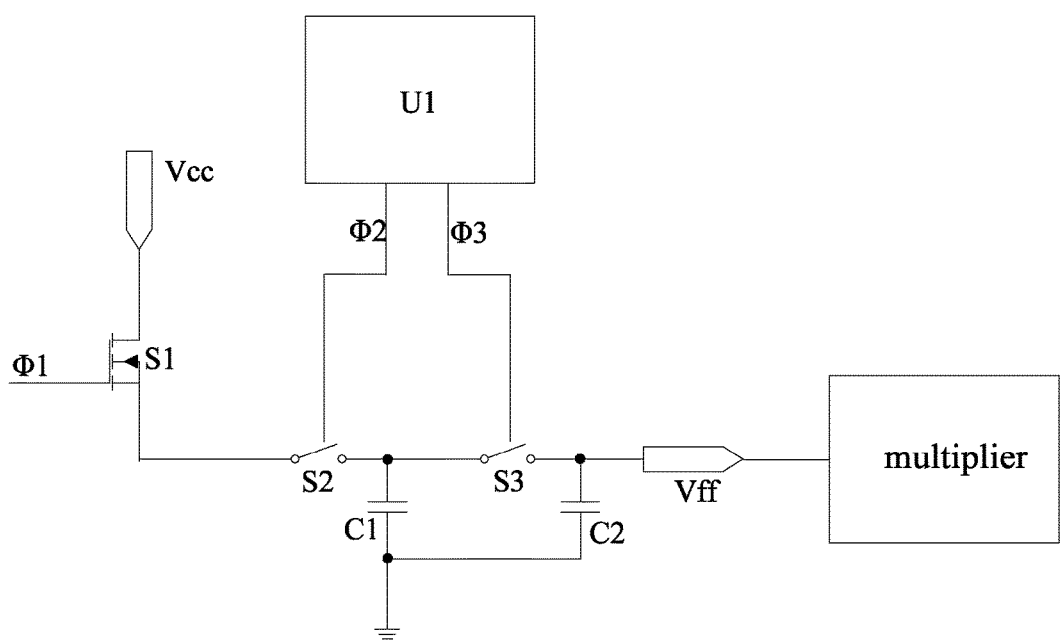
FIG. 3 is a structural diagram of a voltage feed-forward circuit in an exemplary embodiment of the present disclosure.
Figure 5:
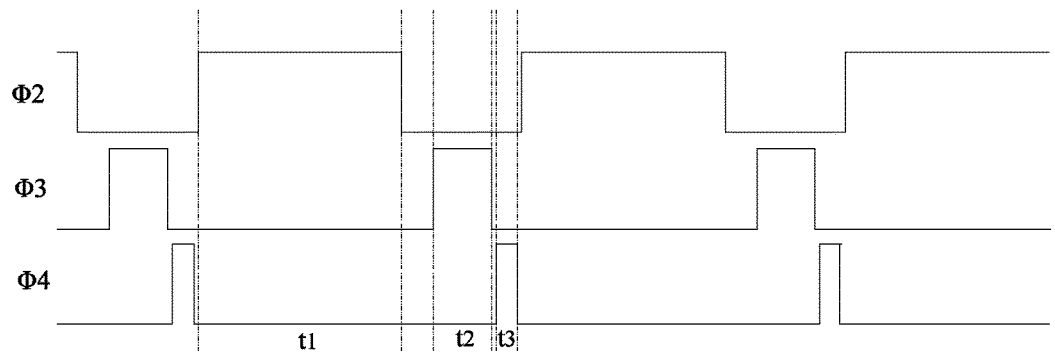
FIG. 5 is a sequence diagram of a control signal of a voltage feed-forward circuit in an exemplary embodiment of the present disclosure.

The present exemplary embodiment firstly provides a voltage feed-forward circuit. The voltage feed-forward circuit is applied to a multiplier for maintaining and outputting a peak voltage of an input voltage to the multiplier. In the present exemplary embodiment, the input voltage is derived from a voltage proportional to an AC supply voltage. Referring to FIG. 3, the voltage feed-forward circuit in the present exemplary embodiment mainly comprises a logic control unit U1, a first switch element S1, a second switch element S2, a third switch element S3, a first capacitor C1 and a second capacitor C2 and the like. In the present exemplary embodiment, the switch element may comprise one or more of a MOSFET switch, an IGBT switch or a BJT switch. Wherein:

The first end of the first switch element S1 is connected to a supply voltage Vcc which is at least higher than the peak voltage of the input voltage Vin, and the control end of the first switch element S1 causes the first switch element S1 to conduct in response to a first control signal Φ1. The logic control unit U1 is used to output a second control signal Φ2 during the peak voltage of the input voltage Vin and output a third control signal Φ3 during a non-peak voltage of the input voltage Vin. Referring to FIG. 5, there is the sequence diagram of control signals output by the logic control unit U1, which shows that a non-overlapping time exists between the second control signal Φ2, the third control signal Φ3 and the fourth control signal Φ4 described below to avoid interference causing noise. The first end of the first capacitor C1 is grounded. The first end of the second switch element S2 is connected to the second end of the first switch element S1, the second end of the second switch element S2 is connected to the second end of the first capacitor C1, and the control end of the second switch element S2 causes the second switch element S2 to conduct in response to the second control signal Φ2. The first end of the third switch element S3 is connected to the second end of the first capacitor C1, and the control end of the third switch element S3 causes the third switch element S3 to conduct in response to the third control signal Φ3. The first end of the second capacitor C2 is grounded, and the second end of the second capacitor C2 is connected to the second end of the third switch element S3. The first control signal Φ1 and the second control signal Φ2 begin to be provided at the same time, and the first control signal Φ1 stops being provided when the voltage of the second end of the first capacitor C1 is greater than the peak voltage of the input voltage Vin.

In the above voltage feed-forward circuit, the first control signal Φ1 and the second control signal Φ2 are provided during the peak voltage of the input voltage Vin to conduct the first switch element S1 and the second switch element S2, so that the power supply Vcc charges the first capacitor C1 through the first switch element S1 and the second switch element S2. When the first capacitor C1 is charged to the peak voltage of the input voltage Vin, the first control signal Φ1 stops being provided so to stop charging the first capacitor C1. During the non-peak voltage of the input voltage Vin, the second switch element S2 is turned off and a third control signal Φ3 is provided to conduct the third switch element S3, the second end of the first capacitor C1 and the second end of the second capacitor C2 are connected, charges stored in the first capacitor C1 is redistributed between the first capacitor C1 and the second capacitor C2 so that the peak voltage of the input voltage Vin can be shared to the second end of the second capacitor C2 and output to the multiplier from the second end of the second capacitor C2. And finally the voltage output from the second end of the second capacitor C2 is:

$$V_{ff}=(V_{C1}\times C1+V_{C2}\times C2)/(C1+C2) \qquad (2)$$

Wherein $V_{C1}$ is a voltage at the second end of the first capacitor C1 before charge redistribution, and $V_{C2}$ is a voltage at the second end of the second capacitor C2 before charge redistribution.

Figure 6:
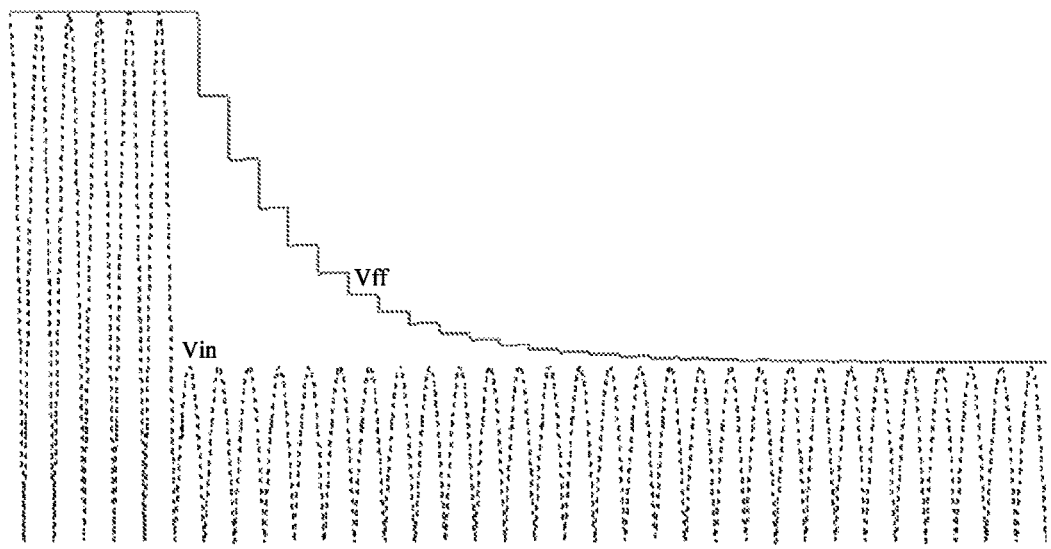
FIG. 6 is a simulation results diagram of output signals of a voltage feed-forward circuit in an exemplary embodiment of the present disclosure.

In the above voltage feed-forward circuit, charges would be shared and redistributed between the first capacitor C1 and the second capacitor C2 once the input voltage Vin is abruptly changed, so that the voltage Vff output from the second end of the second capacitor C2 would be slowly changed, which facilitates the elimination or reduction of the adverse effects of transient fluctuations in the input voltage Vin. And after several cycles it is possible to achieve the purpose of tracking and maintaining the peak voltage of the input voltage Vin, simulation results in FIG. 6 can be a reference in this regard. In addition, in the present exemplary embodiment, the capacitance ratio between the first capacitor C1 and the second capacitor C2 is adjustable, and the rate of change of the voltage output from the second end of the second capacitor C2 can be adjusted by controlling the capacitance ratio between the first capacitor C1 and the second capacitor C2, that is, the slope of the voltage Vff in FIG. 6 can be changed.

Figure 4:
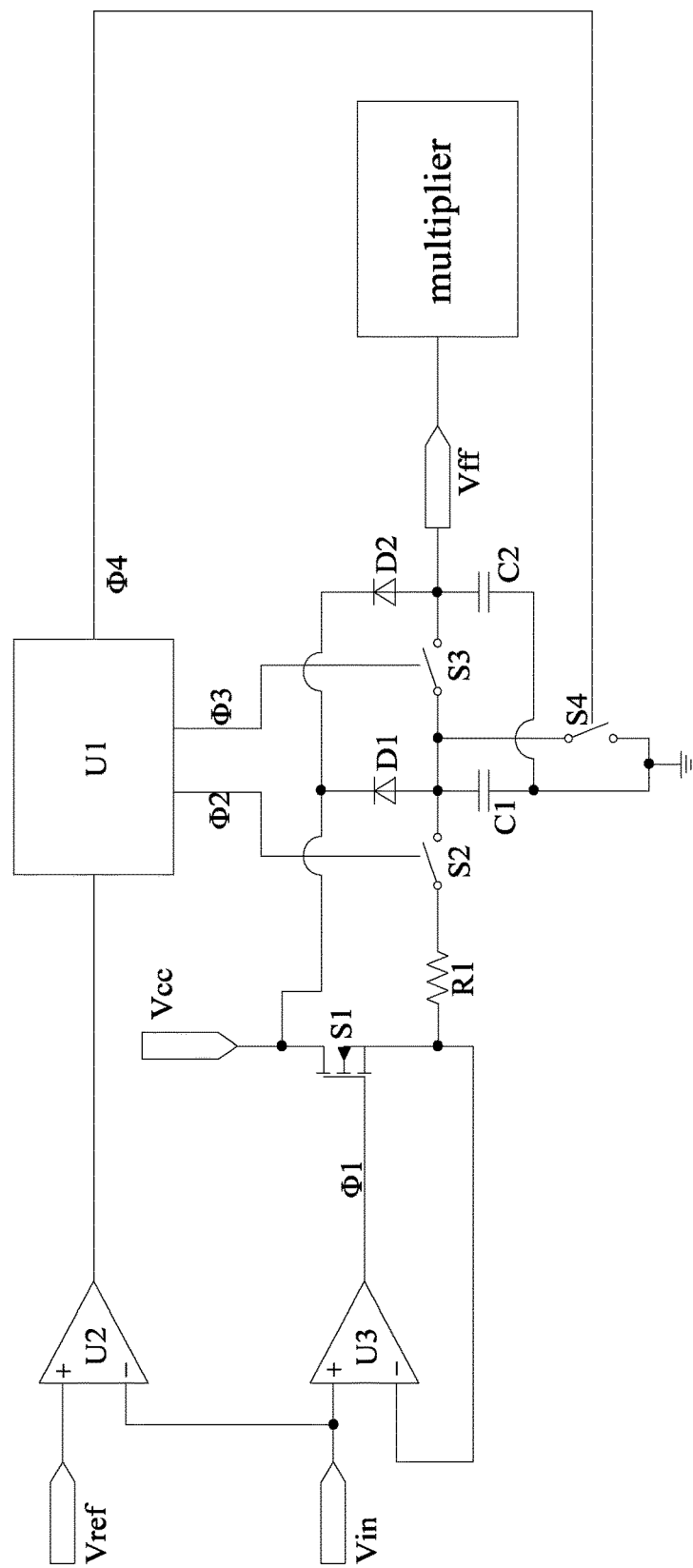
FIG. 4 is a structural diagram of another voltage feed-forward circuit in an exemplary embodiment of the present disclosure.

In the present exemplary embodiment, the logic control unit U1 may also be used to output a fourth control signal Φ4 during the non-peak voltage of the input voltage Vin. Referring to FIG. 4, the voltage feed-forward circuit described in the present exemplary embodiment may further comprise a fourth switch element S4. The first end of the fourth switch element S4 is connected to the second end of the first capacitor C1, the second end of the fourth switch element S4 is grounded, and the control end of the fourth switch element S4 causes the fourth switch element S4 to conduct in response to the fourth control signal Φ4. During the non-peak voltage of the input voltage Vin, the fourth switch element S4 is conducted by the fourth control signal Φ4, so as to discharge the first capacitor C1 to prevent the voltage of the second end of the first capacitor C1 from maintaining at the peak voltage of the input voltage Vin after a sudden decrease in the effective value of the input voltage Vin.

With continued reference to FIG. 4, the voltage feed-forward circuit described in the present exemplary embodiment may further comprise a first comparator U2. The first input end of the first comparator U2 is connected to a reference voltage Vref, the second input end of the first comparator U2 is connected to the input voltage Vin, and the output end of the first comparator U2 outputs a comparison result signal of the input voltage Vin and the reference voltage Vref to the logic control unit U1, and the logic control unit U1 judges accordingly whether or not it is at the peak voltage of the input voltage Vin. For example, if the input voltage Vin is greater than the reference voltage Vref, the output end of the first comparator U2 outputs a low level signal, and the logic control unit U1 judges accordingly it is at the peak voltage of the input voltage Vin. And if the input voltage Vin is less than the reference voltage Vref, the output end of the first comparator U2 outputs a high level signal, and the logic control unit U1 judges accordingly it is at the non-peak voltage of the input voltage Vin.

Continuing referring to FIG. 4, the voltage feed-forward circuit described in the present exemplary embodiment may further comprise a second comparator U3 (or a first operational amplifier). The first input end of the second comparator U3 (or the first operational amplifier) is connected to the input voltage Vin, and the second input end of the second comparator U3 (or the first operational amplifier) is connected to the first end of the first switch element S1 to form a feedback circuit. When the first switch element S1 is conducted, the output end of the second comparator U3 (or the first operational amplifier) outputs a comparison result signal to the control end of the first switch element S1 according to the comparison result of the input voltage Vin and the voltage of the second end of the first capacitor C1. For example, during the initial stage of conduction of the second switch element S2, the voltage of the second end of the first capacitor C1 is 0, so the second comparator U3 (or the first operational amplifier) outputs a high level signal, i.e., the first control signal Φ1, thereby causing the first switch element S1 to conduct, and the supply voltage Vcc charges the first capacitor C1 through the first switch element S1 and the second switch element S2. The voltage of the second end of the first capacitor C1 increases as the input voltage Vin increases, the second comparator U3 (or the first operational amplifier) keeps outputting a high level signal (i.e., the first control signal Φ1) as long as the voltage of the second end of the first capacitor C1 is still less than the peak voltage of the input voltage Vin, that is the charging of the first capacitor C1 has not yet been finished, thereby maintaining the first switch element S1 being conducted. When the voltage of the second end of the first capacitor C1 is not less than the peak voltage of the input voltage Vin, that is the input voltage Vin starts to decrease, the charging of the first capacitor C1 is finished. The first capacitor C1 maintains at the peak voltage of the input voltage Vin since having no discharge path, and the second comparator U3 (or the first operational amplifier) outputs a low level signal which turns off the first switch element S1, thereby stopping charging the first capacitor C1. At this time, the circuit between the second comparator U3 (or the first operational amplifier) and the first switch element S1 remains conductive although the first switch element S1 is in the off state, so to avoid occurrence of the first switch element S1 abruptly charging the first capacitor C1 which would result in voltage overshoot when the first switch element S1 is conducted again. In addition, as shown in FIG. 4, the voltage feed-forward circuit may further comprise a first resistor R1 coupled between the second end of the first switch element S1 and the second end of the first capacitor C1 for current limiting.

Further, the voltage feed-forward circuit in the present exemplary embodiment is formed on an integrated circuit module, and the first capacitor C1 and the second capacitor C2 can be realized using on-chip capacitors. Since the on-chip capacitor is much smaller than the external capacitor and the cycle of the AC signal is longer (50 Hz corresponds to 20 ms), the problem of the holding time of voltage on the on-chip capacitor must be solved if using the on-chip capacitor to replace the external capacitor, that is there is a need to take account of the influence of leakage current which would be particularly severe at high temperature. In the present exemplary embodiment, the main leakage current is from the reverse-biased PN junction between the first capacitor C1 and the second capacitor C2, continuing referring to FIG. 4, the voltage feed-forward circuit in the present exemplary embodiment futher introduces a first reverse-biased PN junction D1 and a second reverse-biased PN junction D2 to balance the overall leakage current. The first reverse-biased PN junction D1 is coupled between the supply voltage Vcc and the second end of the first capacitor C1; the second reverse-biased PN junction D2 is coupled between the supply voltage Vcc and the second end of the second capacitor C2. The first reverse-biased PN junction D1 and the second reverse-biased PN junction D2 are not conducting and reverse-biased in the normal operating state, and the leakage current flows from the supply voltage Vcc into the first capacitor C1 and the second capacitor C2 through the first reverse-biased PN junction D1 and the second reverse-biased PN junction D2. The leakage current can compensate for the leakage current flowing out from the first capacitor C1 and the second capacitor C2.

Compared to the prior art, the present exemplary embodiment uses two on-chip capacitors rather than external resistors to achieve the hold and output of the peak voltage of the input voltage Vin so as to eliminate the ripple of the capacitor and avoid compromise between capacitance and resistance values. Also, the present exemplary embodiment provides the leakage current compensation mechanism to balance the overall leakage current and increase the holding time of voltage on on-chip capacitors. The output voltage of the on-chip capacitor is approximately constant during the holding time, which facilitates stabilizing the output of the multiplier, reducing the THD (total harmonic distortion), and improving the power factor correction effect.

The present exemplary embodiment further provides a multiplier using any one of the above-mentioned voltage feed-forward circuits. The multiplier further comprises a Gilbert multiplier circuit and a bias current generation circuit. The Gilbert multiplier circuit achieves the product of respective hyperbolic tangent functions of two voltages, for getting direct product of the two voltages, the input voltage first needs to be converted from a voltage to a differential current, then the converted differential current flows through a pair of BJT (bipolar transistor) transistors and generates a differential voltage so as to obtain an inverse hyperbolic tangent function. Thus, the multiplier in the present exemplary embodiment further comprises a first differential voltage conversion circuit and a second differential voltage conversion circuit. Of course it will be readily appreciated by those skilled in the art that the multiplier circuit may also be of another type of circuit, and the first differential voltage conversion circuit and the second differential voltage conversion circuit may also be selected as desired, etc. The present exemplary embodiment is not limited to this.

Figure 7:
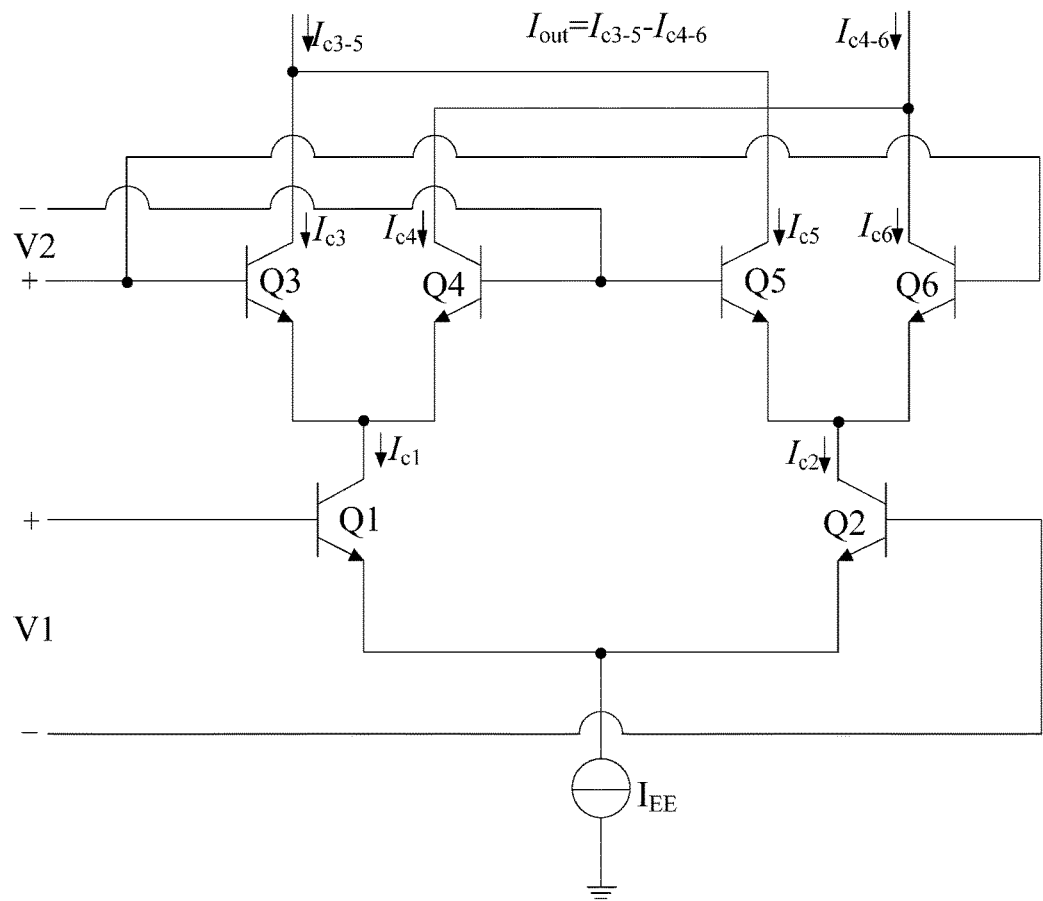
FIG. 7 is a structural diagram of a Gilbert multiplier circuit in an exemplary embodiment of the present disclosure.

FIG. 7 shows a structural diagram of a Gilbert multiplier circuit which is a core unit of the multiplier and comprises a first differential input stage consisting of BJT transistors Q1 and Q2, a second differential input stage consisting of BJT transistors Q3-Q6 and an output stage, wherein the current source $I_{EE}$ provides the bias current $I_{EE}$ to the Gilbert multiplier circuit. The output stage of the Gilbert multiplier circuit outputs the output current Iout obtained by operation with the inputs of the first differential input stage and the second differential input stage. In the present exemplary embodiment, the Gilbert multiplier circuit uses bipolar transistors because exponential properties of the bipolar devices make the linearity thereof better than the multiplier using the field effect device.

The bias current generation circuit is used to generate a bias current based on the peak voltage maintained by the second end of the second capacitor C2 to bias the first signal conversion circuit and the second signal conversion circuit and so as to perform $1/V^2$ conversion. In the present exemplary embodiment, the bias current generation circuit can be seen in FIG. 8, wherein the bias current output from the MOSFET transistor M0 is:

$$IBias=Vff/R3 \qquad (3)$$

The first differential voltage conversion circuit is used to generate a first differential voltage based on a received voltage signal and a first reference voltage Vref1 to bias the first differential input stage, the present exemplary embodiment takes an error feedback voltage Verror as the voltage signal received by the first differential voltage conversion circuit as an example, and of course in other exemplary embodiments, the first differential voltage conversion circuit may also receive other voltage signals. Specifically, the error feedback voltage Verror firstly needs to be converted from a voltage to a differential current, for example a differential current conversion circuit shown in FIG. 9, which uses PNP-type BJT transistors in order to realize conversion of the voltage to the differential current, such that a voltage difference between the input voltage and the first reference voltage Vref1 generates a differential current on the second resistor R2. The generated differential current then flows through a pair of BJT transistors as shown in FIG. 10 and generates a differential voltage, thereby obtaining an inverse hyperbolic tangent function.

The second differential voltage conversion circuit is used to generate a second differential voltage based on a received voltage signal and a second reference voltage Vref2 to bias the second differential input stage, the present exemplary embodiment takes the input voltage Vin as the voltage signal received by the second differential voltage conversion circuit as an example, and of course in other exemplary embodiments, the second differential voltage conversion circuit may also receive other voltage signals. Specifically, the input voltage Vin firstly needs to be converted from a voltage to a differential current, and then the conversion of the inverse hyperbolic tangent is performed. The differential current conversion circuit and the inverse hyperbolic tangent circuit are similar to those in FIGS. 9 and 10 and will not be repeatedly described here. In addition, in order to increase the range of the inputted input voltage Vin, a voltage follower can be used to obtain a minimum input voltage Vin close to 0V.

Figure 9:
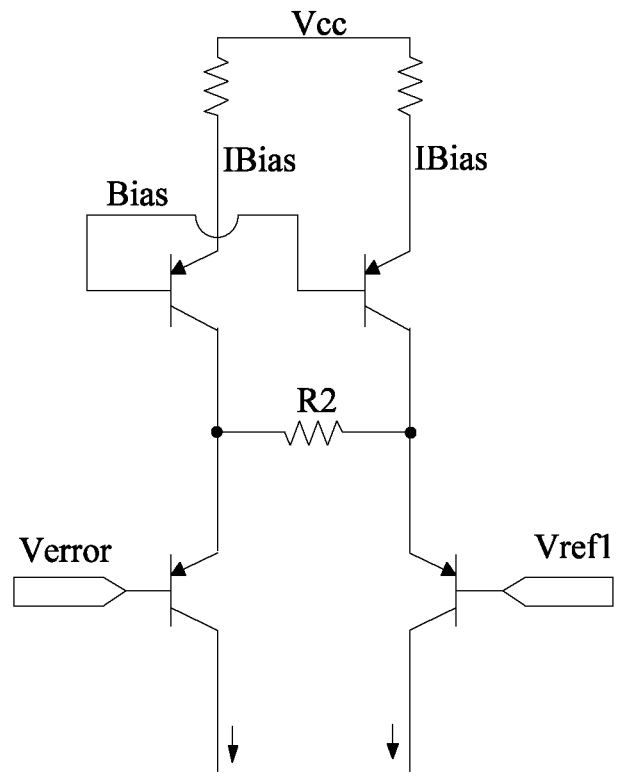
FIG. 9 is a structural diagram of a differential current conversion circuit in an exemplary embodiment of the present disclosure.
Figure 10:
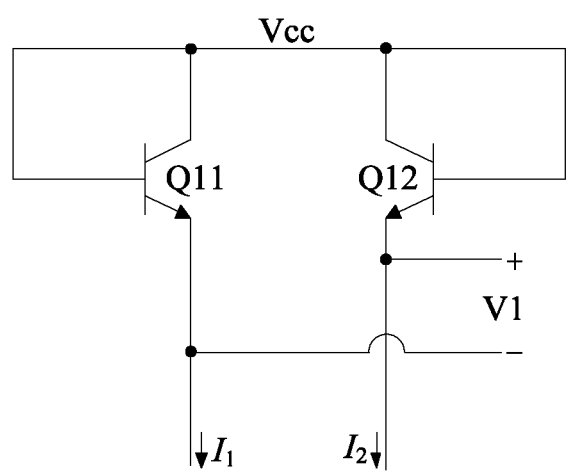
FIG. 10 is a structural diagram of an inverse hyperbolic tangent circuit in an exemplary embodiment of the present disclosure.

Due to process limitations, the PNP device of excellent performance may not be able to provided and the differential current conversion circuit in FIG. 9 is only to achieve a function similar to level conversion, so theoretically the NPN-type BJT transistor can be an alternative. Therefore, the present exemplary embodiment further improves the first differential voltage conversion circuit and the second differential voltage conversion circuit accordingly, so that they can be realized by using NPN-type BJT transistors to greatly extend the range of application of the circuit. Moreover, process requirements can also be reduced without using PNP devices. In addition, NPN devices have a higher gain (Beta), so it can also reduce the error to a certain extent.

Figure 11:
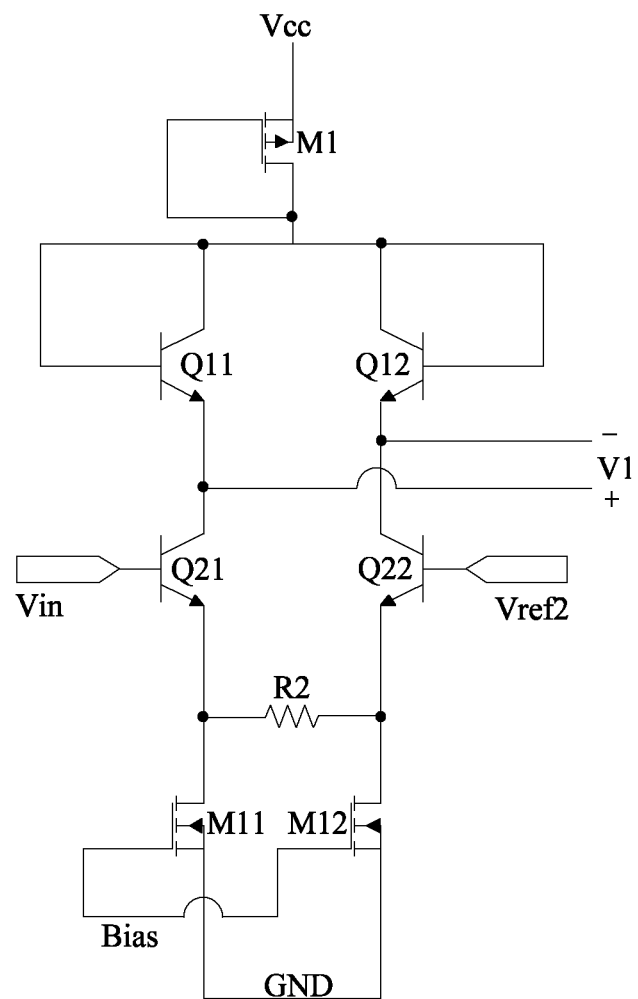
FIG. 11 is a structural diagram of a second differential voltage conversion circuit in an exemplary embodiment of the present disclosure.

Referring to FIG. 11, the second differential voltage conversion circuit may comprise a MOSFET transistor M1, a first BJT transistor pair, a second BJT transistor pair, a second resistor R2 and a first MOSFET transistor pair. The gate of the MOSFET transistor M1 is connected to the drain thereof, and the source thereof is connected to the supply voltage Vcc. The first BJT transistor pair comprises two NPN-type first BJT transistors Q11 and Q12; bases and collectors of the two first BJT transistors are connected to the drain of the MOSFET transistor, and emitters thereof output the second differential voltage. The second BJT transistor pair comprise two NPN-type second BJT transistors Q21 and Q22; bases of the two second BJT transistors receive two different voltage signals respectively, and collectors of the two second BJT transistors are connected to emitters of the two first BJT transistors respectively. The second resistor R2 is coupled between emitters of the two second BJT transistors. The first MOSFET transistor pair comprises two first MOSFET transistors M11 and M12, gates of the two first MOSFET transistors receive the bias current, sources thereof are grounded, and drains thereof are connected to emitters of the two second BJT transistors respectively.

Figure 12:
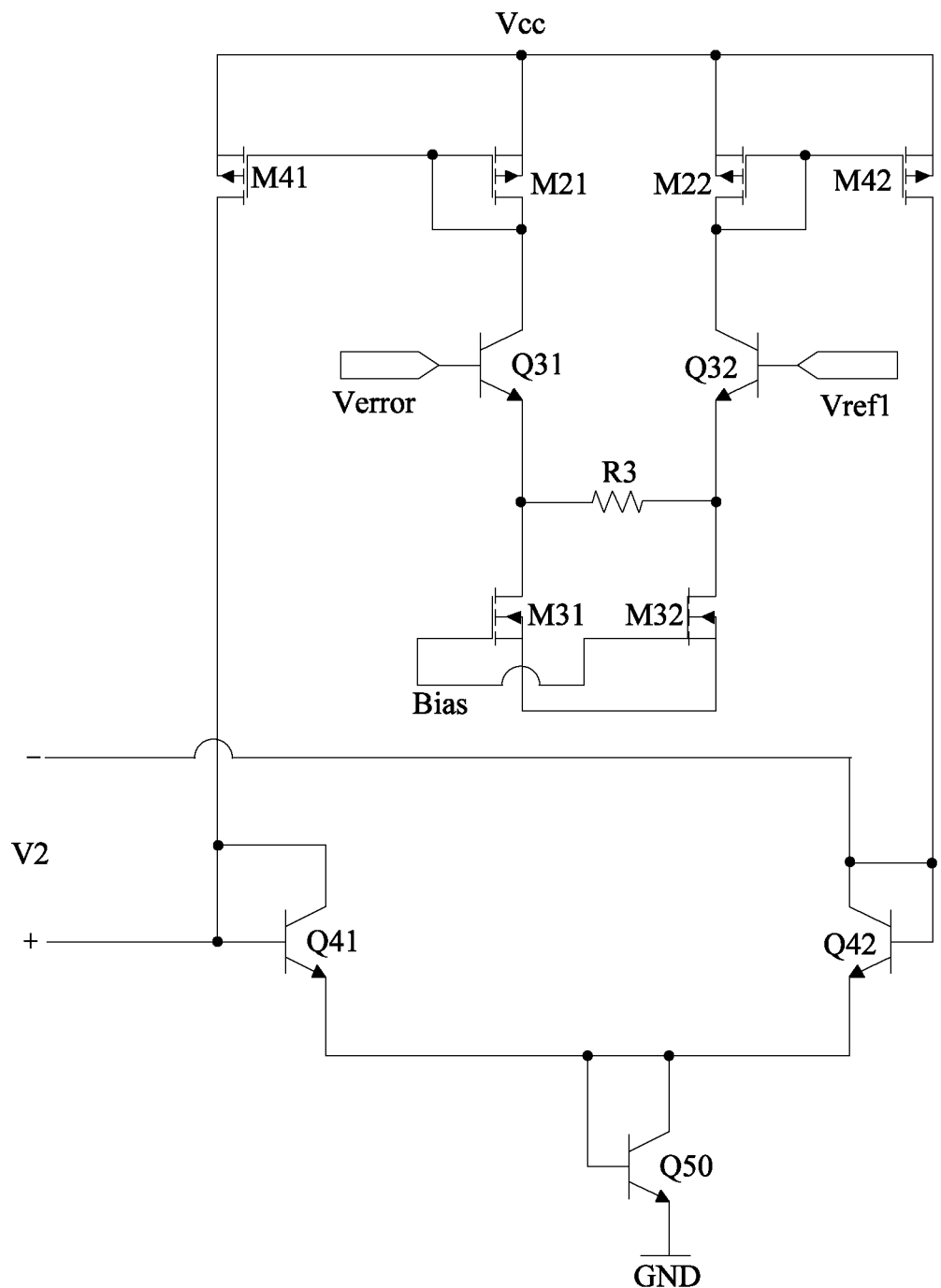
FIG. 12 is a structural diagram of a first differential voltage conversion circuit in an exemplary embodiment of the present disclosure.

Referring to FIG. 12, the first differential voltage conversion circuit comprises a second MOSFET transistor pair, a third BJT transistor pair, a third resistor R3, a third MOSFET transistor pair, a fourth MOSFET transistor pair, a fourth BJT transistor pair and a BJT transistor Q50. The second MOSFET transistor pair comprises two second MOSFET transistors M21 and M22, the gate of each second MOSFET transistor is connected to the drain thereof, and sources thereof are connected to the supply voltage Vcc. The third BJT transistor pair comprises two third BJT transistors Q31 and Q32, bases of the two third BJT transistors receive two different voltage signals respectively, and collectors thereof are connected to drains of the second MOSFET transistors respectively. The third resistor R3 is coupled between emitters of the two third BJT transistors. The third MOSFET transistor pair comprises two third MOSFET transistors M31 and M32, gates of the two third MOSFET transistors receive the bias current, sources thereof are grounded, and drains thereof are connected to emitters of the two third BJT transistors respectively. The fourth MOSFET transistor pair comprises two fourth MOSFET transistors M41 and M42, gates of the two fourth MOSFET transistors are connected to gates of the two second MOSFET transistors respectively, and sources of the two fourth MOSFET transistors are connected to the supply voltage Vcc. The fourth BJT transistor pair comprises two NPN-type fourth BJT transistors Q41 and Q42, bases of the two fourth BJT transistors are connected to drains of the two fourth MOSFET transistors respectively, and collectors thereof output the first differential voltage. The base of the BJT transistor Q50 is connected with the collector thereof and connected to emitters of the two fourth BJT transistors, and the emitter of the BJT transistor Q50 is grounded, the BJT transistor Q50 can boost the DC operating level.

Takes the second differential voltage conversion circuit in FIG. 11 for example, wherein the current of the emitter of the first transistor Q11 is:

$$I\text{Bias}+(V\text{in}-V\text{ref2})/R2 \quad (4)$$

The current of the emitter of the first transistor Q12 is:

$$I\text{Bias}-(V\text{in}-V\text{ref2})/R2 \quad (5)$$

Therefore the differential current output from the differential current conversion circuit in FIG. 9 is:

$$2Vt\times\tan h^{-1}(V\text{in}-V\text{ref2})/(R2\times I\text{Bias}) \quad (6)$$

Figure 8:
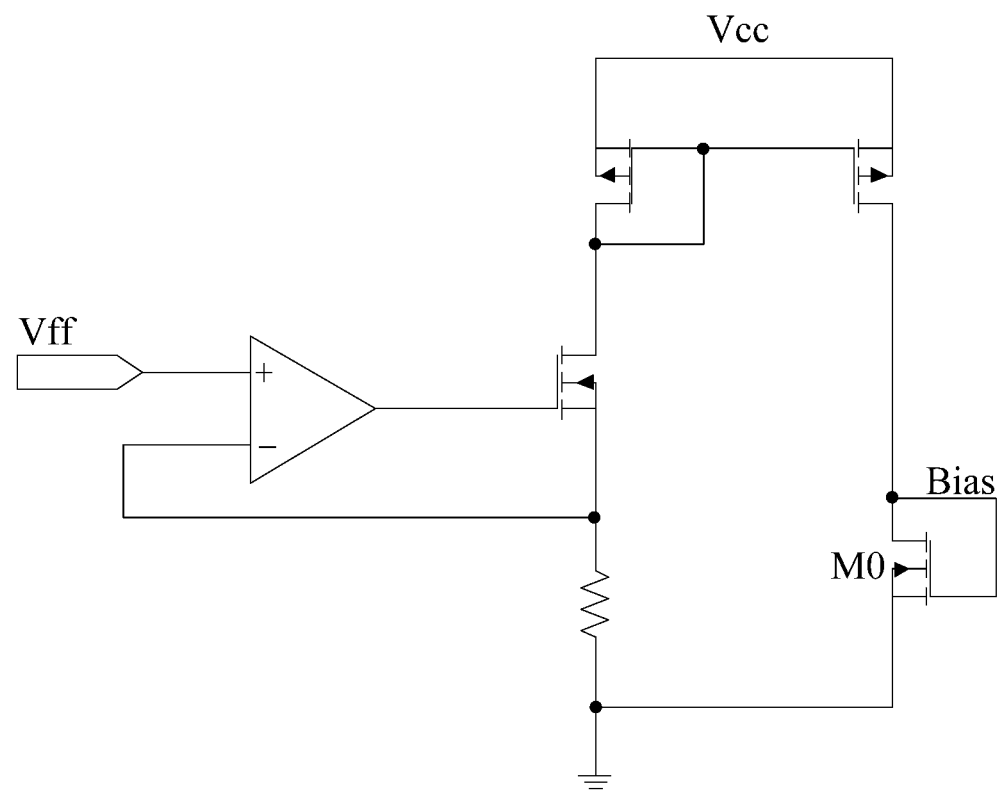
FIG. 8 is a structural diagram of a bias current generation circuit in an exemplary embodiment of the present disclosure.

Substitute the bias current generated by the bias current generation circuit in FIG. 8 into the equation (6):

$$2Vt\times\tan h^{-1}(V\text{in}-V\text{ref2})\times R3/(R2\times Vf\!f) \quad (7)$$

Figure 13:
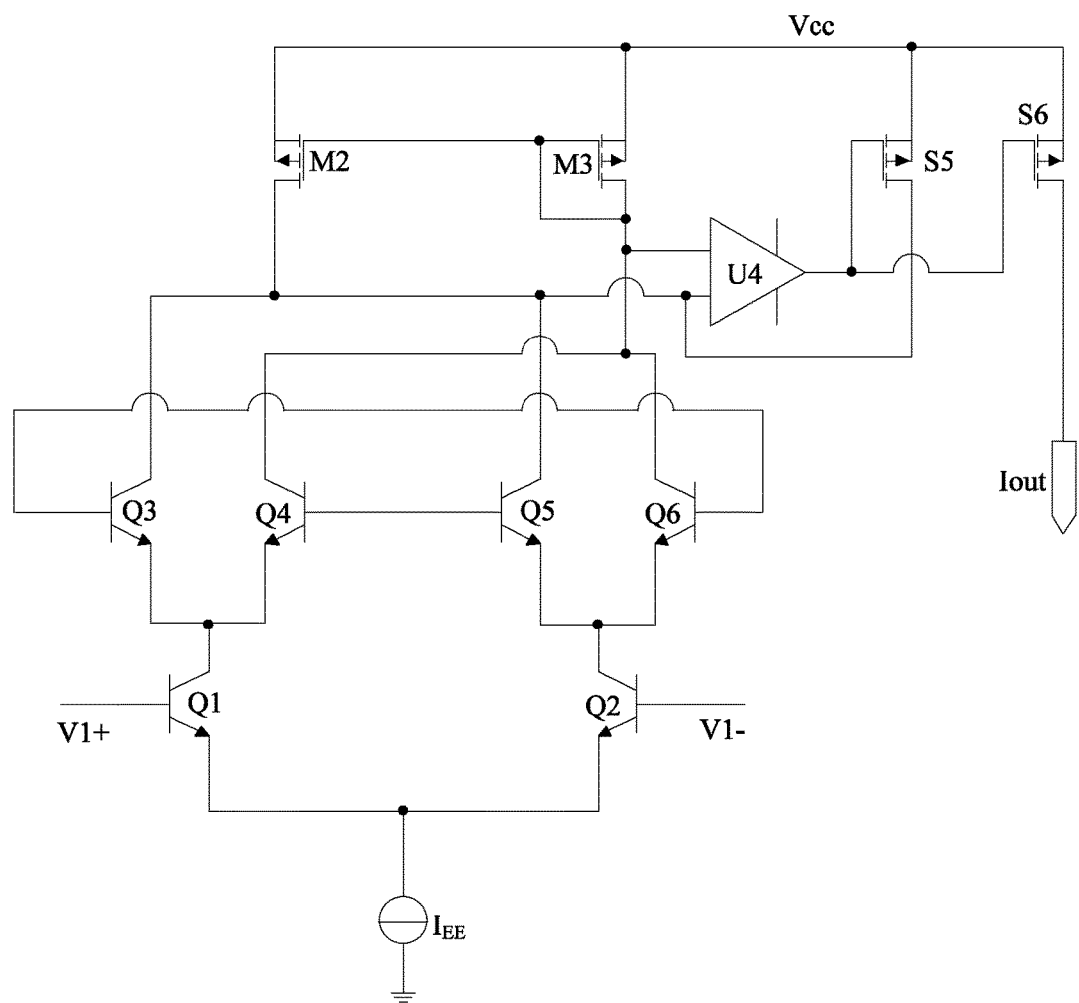
FIG. 13 is a structural diagram of another Gilbert multiplier circuit in an exemplary embodiment of the present disclosure.

The output of the Gilbert multiplier circuit in FIG. 13 is:

$$I_{OUT}=I_{EE}\times\tan h(V1/2Vt)\times\tan h(V2/2Vt) \quad (8)$$

Wherein $I_{EE}$ is the tail current, V1 and V2 are two pairs of input voltage, Iout is the output current.

Substitute the equation (7) into the equation (8):

$$I_{OUT}=I_{EE}\times(V\text{in}1-V\text{ref}1)\times(V\text{in}2-V\text{ref}2)/Vf\!f^2 \quad (9)$$

The equation (9) shows that the circuit contains a $1/Vf\!f^2$ item, thus achieving the function of voltage feed-forward.

Figure 14:
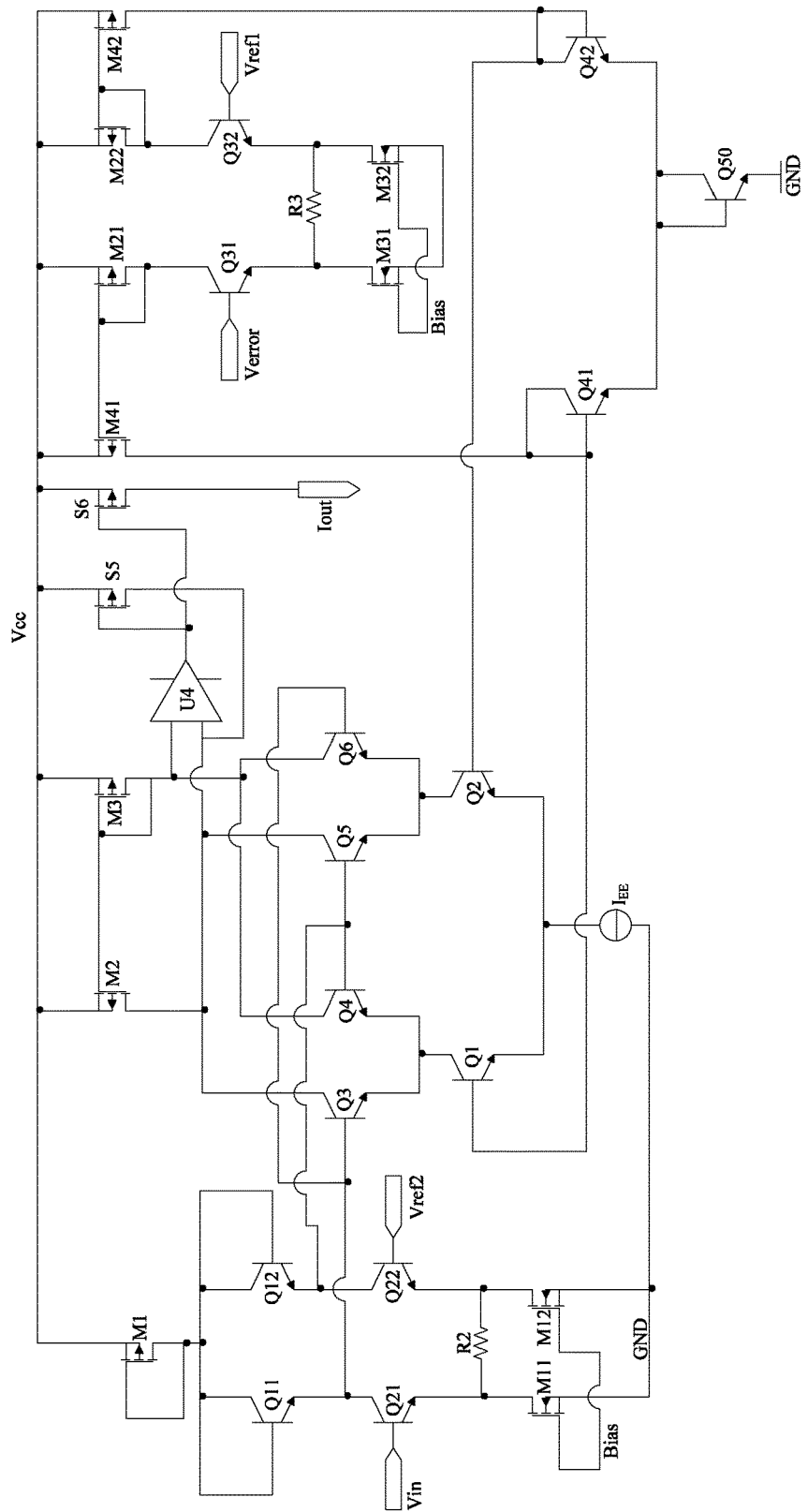
FIG. 14 is an overall structural diagram of a multiplier in an exemplary embodiment of the present disclosure.

In the present exemplary embodiment, the output stage of the Gilbert multiplier circuit comprises a current mirror unit, and the output current Iout of the Gilbert multiplier circuit is output by the current mirror unit. Due to process limitations, the current mirror unit can only use PMOS devices (i.e., the MOSFET transistors M2 and M3 shown in FIG. 13). When a current mirror unit consisting of PMOS devices is used for direct outputting, low current may be output when the error of the input voltage Vin is zero due to its small output resistance. In a solution, a folding structure may be considered, but may conflict with a limited voltage space. In the present exemplary embodiment, a second operational amplifier U4 is provided to form a feedback to ensure that the output current Iout has a high accuracy. The specific circuit is shown in FIG. 13. The current mirror unit comprises two current input ends and a current output end; the output stage further comprises a second operational amplifier U4, a fifth switch element S5 and a sixth switch element S6. Two input ends of the second operational amplifier U4 are connected to two current input ends of the current mirror unit respectively. The first end of the fifth switch element S5 is connected to the current output end of the current mirror unit, the second end of the fifth switch element S5 is connected to one input end of the second operational amplifier U4, and the control end of the fifth switch element S5 is connected to the output end of the second operational amplifier U4. The first end of the sixth switch element S6 is connected to the current output end of the current mirror unit, the second end of the sixth switch element S6 is used to output the output current Iout, and the control end thereof is connected to the output end of the second operational amplifier U4. The above circuit ensures no output current when the error of the input voltage Vin is 0, which results in zero offset voltage and more precise control of the offset voltage of the multiplier. FIG. 14 is the overall structural diagram of the multiplier in the present exemplary embodiment.

The present exemplary embodiment also provides a power factor correction circuit. The power factor correction circuit comprises any of the multipliers provided in the present exemplary embodiment. The power factor correction circuit may be formed on an integrated circuit module, and the first capacitor C1 and the second capacitor C2 are on-chip capacitors. The specific implementation and technical effects of the multiplier of the power factor correction circuit in the present exemplary embodiment have been described in detail, and will not be described in detail herein.

In view of the above, the voltage feed-forward circuit in the exemplary embodiment of the present disclosure achieves maintaining the peak voltage of the input voltage by providing the first capacitor and the second capacitor, and therefore it is not necessary to take into account the compromise of values of the external resistor and the external capacitor in the prior art. Further, since the maintaining of the peak voltage of the input voltage is effected based on the sharing and redistribution of charges between the first capacitor and the second capacitor, it is possible to make the output voltage change slowly, which facilitates the filtering of the transient fluctuation of the input voltage. At the same time, by changing the ratio of the first capacitor and the second capacitor the change slope of the output voltage can be changed. The first capacitor and the second capacitor can be implemented using on-chip capacitors to save system cost. In addition, the present exemplary embodiment increases the holding time of voltage on the internal capacitor by setting the leakage current compensation mechanism so that the output voltage is approximately constant during the holding time, which facilitates the stabilization of the multiplier. The multiplier in the exemplary embodiment of the present disclosure reduces process requirements and extending the application range of the circuit without using PNP transistors. Moreover, the second operational amplifier is used to provide feedback control to improve the output current accuracy of the multiplier and ensure no output current when the error of the input voltage is 0, that is realizing more accurate control of offset voltage of the multiplier.

The present disclosure has been described by the above-described related embodiments, however the above-described embodiments are merely examples to implement the present disclosure. It is to be noted that the disclosed embodiments do not limit the scope of the present disclosure. Rather, all alterations and improvements without departing from the spirit and scope of the present disclosure belong to the scope of patent protection of the present disclosure.

What is claimed is:

1. A voltage feed-forward circuit applied to a multiplier for maintaining and outputting a peak voltage of an input voltage, wherein, comprising:
    a first switch element, a first end thereof connected to a supply voltage, and a control end thereof causing said first switch element to conduct in response to a first control signal;
    a logic control unit used to output a second control signal during the peak voltage of said input voltage and output a third control signal during a non-peak voltage of said input voltage;
    a first capacitor, a first end thereof grounded;
    a second switch element, a first end thereof connected to a second end of said first switch element, a second end thereof connected to a second end of said first capacitor, and a control end thereof causing said second switch element to conduct in response to said second control signal;
    a third switch element, a first end thereof connected to the second end of said first capacitor, and a control end thereof causing said third switch element to conduct in response to said third control signal; and
    a second capacitor, a first end thereof grounded, and a second end thereof connected to a second end of said third switch element and outputting the peak voltage of said input voltage maintained by the second end of said second capacitor;
    wherein said first control signal and said second control signal begin to be provided at the same time, and the first control signal stops being provided when a voltage of the second end of said first capacitor is greater than the peak voltage of said input voltage; and
    wherein said logic control unit is further used to output a fourth control signal during the non-peak voltage of said input voltage, said voltage feed-forward circuit further comprising:
    a fourth switch element, a first end thereof connected to the second end of said first capacitor, a second end thereof grounded, and a control end thereof causing said fourth switch element to conduct in response to said fourth control signal.

2. The voltage feed-forward circuit according to claim 1, wherein said voltage feed-forward circuit further comprises:
    a first comparator, a first input end thereof connected to a reference voltage, a second input end thereof connected to said input voltage, and an output end thereof outputting a comparison result signal of said input voltage and said reference voltage to said logic control unit.

3. The voltage feed-forward circuit according to claim 2, wherein said voltage feed-forward circuit further comprises:
    a second comparator or a first operational amplifier, a first input end thereof connected to said input voltage, a second input end thereof connected to the first end of said first switch element, and an output end thereof outputting said first control signal to the control end of said first switch element when a voltage of the second end of said first capacitor is less than the peak voltage of said input voltage.

4. The voltage feed-forward circuit according to claim 1, wherein said voltage feed-forward circuit further comprises:
    a first reverse-biased PN junction coupled between said supply voltage and the second end of said first capacitor;
    a second reverse-biased PN junction coupled between said supply voltage and the second end of said second capacitor.

5. The voltage feed-forward circuit according to claim 1, wherein said voltage feed-forward circuit further comprises:
    a first resistor coupled between the second end of said first switch element and the second end of said first capacitor.

6. The voltage feed-forward circuit according to claim 1, wherein a capacitance ratio between said first capacitor and said second capacitor is adjustable.

7. The voltage feed-forward circuit according to claim 6, wherein a non-overlapping time exists between said second control signal, said third control signal and said fourth control signal.

8. A multiplier, comprising the voltage feed-forward circuit according to claim 1.

9. The multiplier according to claim 8, wherein said multiplier further comprises:
    a Gilbert multiplier circuit comprising a first and a second differential input stage and an output stage; said output stage outputs an output current obtained by operation with the inputs of said first and said second differential input stages;
    a first differential voltage conversion circuit used to generate a first differential voltage based on a received voltage signal and a first reference voltage to bias said first differential input stage;
    a second differential voltage conversion circuit used to generate a second differential voltage based on a received voltage signal and a second reference voltage to bias said second differential input stage;
    a bias current generation circuit used to generate a bias current based on said peak voltage maintained by the second end of said second capacitor to bias said first signal conversion circuit and said second signal conversion circuit.

10. The multiplier according to claim 9, wherein said second differential voltage conversion circuit comprises:
    a MOSFET transistor, a gate thereof connected to a drain thereof, and a source thereof connected to said supply voltage;
    a first BJT transistor pair comprising two NPN-type first BJT transistors, bases and collectors of two said first BJT transistors connected to the drain of said MOSFET transistor, and emitters thereof outputting said second differential voltage;

a second BJT transistor pair comprising two NPN-type second BJT transistors, bases of two said second BJT transistors receive two different voltage signals respectively, and collectors thereof connected to emitters of two said first BJT transistors respectively;

a second resistor coupled between emitters of two said second BJT transistors;

a first MOSFET transistor pair comprising two first MOSFET transistors, gates of two said first MOSFET transistors receiving said bias current, sources thereof grounded, and drains thereof connected to emitters of two said second BJT transistors respectively.

11. The multiplier according to claim 10, wherein the base of one said second BJT transistor receives said input voltage or an error feedback voltage, the base of the other second BJT transistor receives said second reference voltage.

12. The multiplier according claim 9, wherein said first differential voltage conversion circuit comprises:

a second MOSFET transistor pair comprising two second MOSFET transistors, a gate of each second MOSFET transistor connected to a drain thereof, and a source thereof connected to said supply voltage;

a third BJT transistor pair comprising two third BJT transistors, bases of two said third BJT transistors receive two different voltage signals respectively, and collectors thereof connected to drains of said second MOSFET transistors respectively;

a third resistor coupled between emitters of two said third BJT transistors;

a third MOSFET transistor pair comprising two third MOSFET transistors, gates of two said third MOSFET transistors receive said bias current, sources thereof grounded, and drains thereof connected to emitters of two said third BJT transistors respectively;

a fourth MOSFET transistor pair comprising two fourth MOSFET transistors, gates of two said fourth MOSFET transistors connected to gates of two said second MOSFET transistors respectively, and sources thereof connected to said supply voltage;

a fourth BJT transistor pair comprising two NPN-type fourth BJT transistors, bases of two said fourth BJT transistors connected to drains of two said fourth MOSFET transistors respectively, and collectors thereof outputting said first differential voltage;

a BJT transistor, a base thereof connected with a collector thereof and connected to emitters of two said fourth BJT transistors, and a emitter thereof grounded.

13. The multiplier according to claim 12, wherein the base of one said third BJT transistor receives said input voltage or an error feedback voltage, the base of the other third BJT transistor receives said first reference voltage.

14. The multiplier according to claim 9, wherein said output stage comprises a current mirror unit, said current mirror unit comprises two current input ends and a current output end; said output stage further comprises:

a second operational amplifier, two input ends thereof connected to two current input ends of said current mirror unit respectively;

a fifth switch element, a first end thereof connected to the current output end of said current mirror unit, a second end thereof connected to one input end of said second operational amplifier, and a control end thereof connected to an output end of said second operational amplifier;

a sixth switch element, a first end thereof connected to the current output end of said current mirror unit, a second end thereof used to output said output current, and a control end thereof connected to the output end of said second operational amplifier.

15. A power factor correction circuit, comprising said multiplier in accordance with claim 8.

16. The power factor correction circuit according to claim 15, wherein said power factor correction circuit is formed on an integrated circuit module, said first capacitor and the second capacitor are on-chip capacitors.

\* \* \* \* \*